US006194753B1

(12) United States Patent
Seon et al.

(10) Patent No.: US 6,194,753 B1
(45) Date of Patent: Feb. 27, 2001

(54) METHOD OF FORMING A PEROVSKITE STRUCTURE SEMICONDUCTOR CAPACITOR

(75) Inventors: Jeong-Min Seon, Jeonranam-Do; Hwan-Myeong Kim, Choongcheongbuk-Do, both of (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/233,420

(22) Filed: Jan. 20, 1999

Related U.S. Application Data

(62) Division of application No. 08/756,371, filed on Nov. 26, 1996, now Pat. No. 5,879,956.

(30) Foreign Application Priority Data

Dec. 27, 1995 (KR) .................................. 95-58736
Dec. 27, 1995 (KR) .................................. 95-58736

(51) Int. Cl.$^7$ .................................................. H01L 29/72
(52) U.S. Cl. ......................... 257/295; 257/310; 257/532
(58) Field of Search .................................. 257/295, 310, 257/532

(56) References Cited

U.S. PATENT DOCUMENTS

| 5,248,564 | 9/1993 | Ramesh | 257/295 |
| 5,519,235 | 5/1996 | Ramesh | 257/295 |
| 5,679,969 | 10/1997 | Evans, Jr. et al. | 257/295 |

OTHER PUBLICATIONS

Yoon, Soon–Gil, "Preparation of thin–film $(BA_{0-5}Sr_{0-5})TiO_3$ by the laser ablation technique and electrical properties," J. Appl. Phys. 75 (5), Sep. 1, 1994, pp. 2999–3003.

Jia,Q.X., et al., "Effect of Barrier Layers on $BaTiO_3$ Thin Film Capacitors on Si Substrates," State Univ. of NY at Buffalo, Dept. of Elec. and Comp. Eng., 1993, pp. 53–56.

Torii, Kazuyoshi, et al., "Single–Target Sputtering Process for PZT Thin Films with Precise Composition Control," Extended Abstracts of the 1991 Intl. Conf. on Solid State Driven and Materials, Yokohama, 1991, pp. 195–197.

Katsuhiro Aoki, et al., "Controlling Crystalline Orientations of Sol–Gel PZts for FRAM and DRAM Applications," ULSI Develop. & Prod., Texas Instr. Japan Ltd., Ibaraki–kea 300–04, date unknown.

Mceckly, B.H., et al., "Growth and properties of $YBa_2Cu_3O_7$–thin films on vicinal and polycrystalline MgO substrates," Appl. Phys. Lett. 57 (27), Dec. 31, 1990, pp. 2951–2953.

Eiki Narumi, et al., "C–Axis Oriented $Ba_2Cu_3O_{6.8}$ Films on Amorphous Silicate Glasses Using Laser Deposition," NY State Inst. on Superconductivity, Buffalo, NY, accepted for publication Feb. 19, 1991.

*Primary Examiner*—Edward Wojciechowicz
(74) *Attorney, Agent, or Firm*—Fleshner & Kim, LLP

(57) ABSTRACT

A semiconductor capacitor structure is made from a fabrication method which includes a step for forming an insulation film having a contact hole so that a portion of a substrate is exposed therethrough. Thereafter, a composite first electrode composed of a conductive plug, an anti-oxide film and a Perovskite structure conductive seed layer are formed on a portion of the insulation film including the contact hole. A Perovskite structure dielectric film is formed on the first electrode, and a Perovskite structure second electrode on the dielectric film is formed. The capacitor has a high dielectric constant approaching that of an epitaxial structure of a mono-crystalline substrate, and interfaces with more stabilized grain boundaries than those of a poly-crystalline structure. Hence, the reduction of trapped charge density between interfaces of the electrodes and dielectric films leads to a decreased leakage current and an improved TDDB (time-dependent direct breakdown) property.

22 Claims, 4 Drawing Sheets

METHOD OF FORMING A PEROVSKITE STRUCTURE SEMICONDUCTOR CAPACITOR

This application is a Divisional of Application No. 08/756,371 filed Nov. 26, 1996 now U.S. Pat. No. 5,879,956.

TECHNICAL FIELD

The present invention relates to a capacitor, and more particularly, to an improved structure and method of making a semiconductor memory cell capacitor using a high dielectric film of Perovskite structure.

BACKGROUND ART

With memory chips becoming increasingly integrated, a memory cell and the cell surface area thereof in which a capacitor is to be formed are becoming smaller. Subsequently, as a proper method for securing a Dynamic Random Access Memory (hereinafter, "DRAM") with a 25 fF (pico Farad)/Cell capacitance in such a small portion of a cell, several studies are being conducted for fabricating a thinner NO (nitrogen-oxygen) dielectric film into three-dimensional capacitor structures, such as a cylinder type capacitor, a fin type capacitor, a trench type capacitor, and applying $Ta_2O_5$ ($\epsilon r=24$) having a high dielectric constant ($\epsilon r$) or a Perovskite structure material such as $(Ba_{0.5},Sr_{0.5})TiO_3$ ($\epsilon r<300$) (hereinafter, "BSTO") or $Pb(La,Zr)TiO_3$ (hereinafter, "PLZT") to the dielectric film for forming a capacitor.

When used as a Perovskite type dielectric material, BSTO or PLZT exhibits a high dielectric constant due to the displacement occurring between the Ti and O atomic surfaces, and tends to exhibit ferroelectric properties. In recent studies, two directions have been investigated in applying a Perovskite structure BSTO or PLZT having a high dielectric constant to a capacitor dielectric film for a DRAM or Ferroelectric Random Access Memory (hereinafter, "FRAM").

One proposal is to form an electrode layer such as $YBa_2Cu_3O_{7-x}$ (hereinafter, "YBCO") or $La_{1-x}Sr_xCoO_3$ (x=0.5) (hereinafter, "LSCO") on a substrate composed of a mono-crystalline, such as MgO or STO, which exhibits a proper lattice matching with BSTO or PLZT. High dielectric constant films of Perovskite structure are consecutively formed thereon into an epitaxial structure, which is comparable in bulk physical properties with a dielectric film having no grain boundaries.

The other proposal is to form a poly-crystalline high dielectric film on a lower side electrode layer composed of $Pt/Ti/SiO_2$ or $RuO_2/SiO_2$. The structure is focused on improving the dielectric and electrical properties of the dielectric film. The deposition conditions, such as temperature and oxygen partial pressure, are regulated instead of regulating a crystalline orientation direction thereof in relation with the lower side electrode.

According to an article in J. Appl. Phys., Vol. 76, No. 5, Sep. 1, 1994, whose disclosure is incorporated by reference, (001)-phase-oriented high dielectric film of a Perovskite structure has no grain boundaries therein exhibits a higher dielectric constant than those of a poly-crystalline structure, which results from the epitaxial structure. Since a (001)-phase orientation denotes a higher dielectric constant than those of other phase orientations, excellent electric properties and flat surfaced film are secured. Even with such excellent properties of the epitaxial structure, application thereof encounters difficulties in manufacturing memory chips adopting an epitaxial structure, and the properties are still under study.

Studies continue on a poly-crystalline high dielectric film which is applicable to memory chips. Leading examples for electrode layer materials being employed in a poly-crystalline structure are metallic electrode layers of $Pt/Ti/SiO_2$ and conductive oxide films, such as $RuO_x$, $RuO_2/Ru$. In recent years, Perovskite conductive oxide films, such as $SRU(SrRuO_3)$, are being considered as lower side electrode layer materials.

An article in Journal of Electronic Materials, Vol. 23, No. 1, 1994, whose disclosure is incorporated herein by reference, reveals that a Pt-related electrode causes electrical short circuits in a capacitor due to hillock generation during a high temperature process thereof and causes grain growth therein which produces difficulties in chip fabrication. Further, $RuO_2$ or SRO enables formation of a high dielectric film with improved properties. In a poly-crystalline structure, as described above, a high dielectric film is deposited at a temperature below 650° C., according to a report in Extended Abstracts of the 1991 International Conference on Solid State Devices and Materials, Yokohama, 1991, pp. 195–197.

However, the high dielectric film deposited on a substrate at such a low temperature has a tendency towards a certain crystal phase depending on the deposition conditions. Further, it is difficult to regulate the crystal phase therein, and there may occur an incomplete crystal formation therein. The dielectric film deposited thereon is composed of both a plurality of smaller grains and subsequently increased grain boundaries. An unstable phase may be formed therein resulting from boundary segregation between grains.

As described in Extended Abstracts of the 1994 International Conference on Solid State Devices and Materials, Yokohama, 1994, pp. 682–684, a BSTO (100) phase is preferred on a $RuO_2$ (110) phase, and a $PZT(Pb(Zr,Ti)O_3)$ (100) phase is known to be formed preferentially on a Pt (111) phase within a certain deposition temperature. However, both phases are known to cause disadvantages such as a difficulty in forming a complete (001) phase Perovskite dielectric film and the generation of growth of other phases.

Further, although the upper surface of the high dielectric film is generally flat, the film itself has random crystal phases instead of predetermined ones, and interfaces are formed therebetween devoid of electrode layers or lattice matchings. Hence, interfaces having larger surface energy, as in high angle grain boundaries, are formed.

Therefore, there are several disadvantages with regard to the above-described dielectric film. Trapped charges occur along the interface between the electrode layer and grain boundaries within the high dielectric film. Thus the leakage current is increased while the TDDB (time-dependent direct breakdown) is decreased. Moreover, the high dielectric film, which is formed on an electrode layer and has a random poly-crystalline structure, exhibits a lower dielectric constant than that of an epitaxial structure or a poly-crystalline structure with a single phase orientation.

DISCLOSURE OF THE INVENTION

An advantage of the present invention is in decreasing leakage current.

Another advantage of the present invention is in improving the TDDB.

The present invention is achieved in part by a semiconductor device comprising: a first electrode including a first conductive oxide film of a Perovskite structure; a second electrode including a second conductive oxide film of a Perovskite structure; and a first Perovskite dielectric film formed between the first and second electrodes.

The above advantages, objects and others are achieved in part by a capacitor structure having a substrate, an insulation film formed on the substrate and having a contact hole so that a portion of the substrate surface is exposed therethrough, a first electrode formed on a portion of the substrate including the contact hole and having a conductive plug, an anti-oxide film formed on the conductive plug, a Perovskite structure conductive seed layer formed on the anti-oxide film, a Perovskite structure high dielectric film formed on the first electrode, and a Perovskite structure second electrode formed on the high dielectric film.

Additionally, a capacitor structure according to a second embodiment of the present invention includes a substrate, a first insulation film formed thereon and having a contact hole exposing a portion of a surface of the substrate therethrough, a first electrode formed on the first insulation film including the contact hole and having a conductive plug, an anti-oxide film formed thereon and a Perovskite structure high dielectric film formed thereon, first side wall spacers formed on each side of the first electrode, a Perovskite structure first dielectric film deposited on the first insulation film including the first electrode and the first side wall spacers so that a portion of the first electrode is exposed through the first dielectric film, a Perovskite structure second electrode formed on the first dielectric film, a Perovskite structure second dielectric film formed on the second electrode so as to have the same width as that of the first electrode, second side wall spacers formed on inner surfaces of each of the first dielectric film, the second electrode and the second dielectric film, a Perovskite structure third electrode formed on the second dielectric film including the second side wall spacers and the exposed portion of said first electrode, a second insulation film formed on the third electrode, third side wall spacers formed on each side of each of the second dielectric film, the third electrode and the second insulation film, and a fourth electrode formed on the second insulation film including each of the third side wall spacers and a portion of the surface of the second electrode.

Further, a method for making a capacitor in accordance with a first embodiment of the present invention comprises forming on a substrate an insulation film having a contact hole exposing a portion of a surface of the substrate therethrough, forming on a portion of the insulation film including the contact hole a composite first electrode composed of a conductive plug, an anti-oxide film, and a Perovskite structure conductive seed layer, forming a Perovskite structure dielectric film on the first electrode, and forming a Perovskite structure second electrode on the dielectric film.

Still further, a method for making a capacitor in accordance with a second embodiment of the present invention includes forming on a substrate a first insulation film having a first contact hole therein for exposing a portion of a surface of the substrate therethrough, forming a first electrode in which a conductive plug, a anti-oxide film and a Perovskite structure conductive seed layer are sequentially stacked on a portion of the first insulation film including the first contact hole, forming first side wall spacers on each side of the first electrode, forming each of a Perovskite structure first dielectric film, a Perovskite structure second electrode and a Perovskite second dielectric film deposited sequentially on the first insulation film including each of the first electrode and the first side wall spacers, etching each of the first dielectric film, the second electrode and the second dielectric film to form a second contact hole therein for exposing a portion of the first electrode therethrough, forming second side wall spacers on each wall of the second contact hole, forming each of a Perovskite structure third electrode and a second insulation film sequentially on the second dielectric film including the second contact hole, etching each of the second insulation film, the third electrode and the second dielectric film to form a third contact hole so that a portion of the second electrode is exposed therethrough, forming third side wall spacers on each wall of the third contact hole, and a tenth step for forming a fourth electrode on the second insulation film including the third contact.

Additional advantages, objects and other features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

BEST MODE FOR CARRYING OUT THE INVENTION

A semiconductor memory cell capacitor employs a dielectric film exhibiting dielectrical and electrical properties which rival those of an epitaxial film. When a dielectric film of a Perovskite structure is deposited at a high temperature of 650° C. through 750° C., the grains therein become larger, and segregation between grain boundaries decreases. Hence, complete grain boundaries, such as those of bi-crystals, are formed therein, and crystal phases having low surface energy, as against each grain therein, exhibit atomic and flat orientation on the dielectric film surface.

Figure 1:
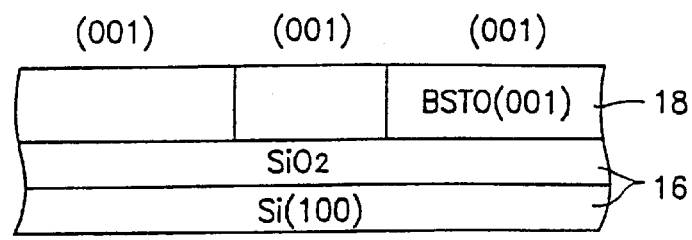
FIG. 1 is a cross-sectional view of a BSTO (001) film structure grown on a Si (100) substrate.

FIG. 1 shows a BSTO (001) film grown on a $SiO_2$/Si (100) substrate 16. The BSTO is deposited on the entire surface of $SiO_2$/Si (100) substrate 16 at 700° C. to grow a BSTO film 18 having a (001) phase with a highly flat structure due to the low surface energy of the (001) phase. When the BSTO film 18, having a lower surface energy and a higher dielectric constant at a high temperature, is employed as a dielectric film for a memory chip capacitor, the dielectric film has a high dielectric constant approaching that of an epitaxial structure BSTO film without using a mono crystalline substrate. Since there are only unsegregated, stable and vertical grain boundaries in the BSTO film 18, when an electrode layer is formed thereon, which makes a proper lattice matching with the BSTO (001) phase therebeneath, the trapped charge sources are reduced due to a stable interface being formed between the electrode and dielectric layers. Hence, a dielectric film has highly improved electrical properties.

A conductive oxide film of a Perovskite structure employs either YBCO or LSCO. Each creates a proper lattice matching with BSTO or PLZT which respectively composes a dielectric thin film of Perovskite structure. Examples of LSCO are $La_{1-x}Sr_xCo_1O_3$ (x=0.5) (hereinafter, "LSCoO") and $La_{2-x}Sr_xCu_1O_4$ (x=0.15) (hereinafter, "LSCuO"), wherein LSCuO excels over the former in terms of its properties.

When YBCO or LSCO is deposited on a predetermined portion of a memory cell as a conductive oxide film, and there are provided an a-axis oriented phase (100), a b-axis oriented phase (010), and a c-axis oriented phase (001) running perpendicular to the other axes in a three-dimensional coordinate system, the (001) phase exhibits the lowest surface energy and fastest crystal growth rate among the three phases. When a poly-crystalline MgO having a random crystal phase, not preferentially cultured to a predetermined phase thereof, and an amorphous YSZ are processed at a high temperature of 650° C. to 750° C., and a conductive oxide film is grown thereon, a nucleation reaction occurs therein at the early stage, due to the low surface energy of the (001) phase. Since the fast growing (001) phase rises more quickly to a certain thickness sufficient to prevent the growth of other phases regardless of the other-phase generations caused by the nucleation speed, the c-axis oriented phase is formed completely at the interface thereof.

There are reports which relate to the above as follows: Appl. Phys. Lett., Vol. 57, No. 27, Dec. 31, 1994, and Japanese Journal of Applied Physics Vol. 30, No. 4A, April, 1991, pp. L585–L586.

With the formation of a BSTO or PLZT dielectric film having a seed layer adopting a (001) Perovskite structure conductive oxide film of a (001) Perovskite structure, which is c-axis preferentially oriented, a complete (001) dielectric film can be secured in accordance with mutual lattice matching thereof. Hence, the trapped charge density is significantly reduced as a result of the stable interface between the seed layer and the dielectric film.

Figure 2:
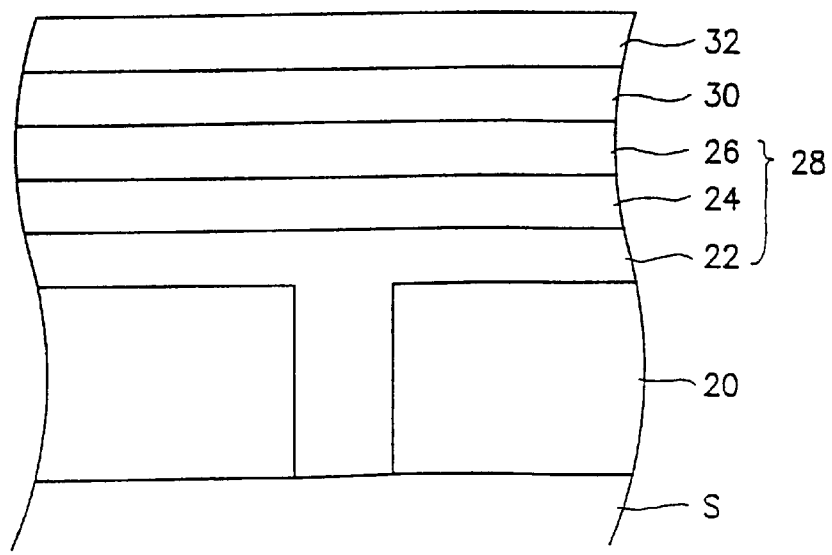
FIG. 2 is a cross-sectional view of a single layer capacitor structure in a semiconductor memory cell employing a dielectric thin film of a Perovskite structure, in accordance with a first embodiment of the present invention.

In conjunction with FIGS. 2 and 3, there will be described the provision of a high integration semiconductor memory cell capacitor structure adopting a Perovskite structure dielectric film having a seed layer provided by a c-axis preferentially cultured Perovskite conductive oxide film. FIG. 2 shows the structure of a single semiconductor memory cell capacitor in accordance with a first embodiment of the present invention, and the fabrication process thereof will be detailed hereunder.

First, an insulation film 20 is formed on a substrate S and etched to form a first contact hole 21 therein so that a portion of the surface of the substrate 20 is exposed. Then, a poly-silicon layer 22 is deposited on a predetermined portion of the insulation film 20 including the first contact hole 21, whereby a conductive plug 22 is formed thereby. An anti-oxide film 24, such as a RuOx conductive anti-oxide film, is formed on the conductive plug 22. A c-axis preferentially cultured LSCO or YBCO is formed as a seed layer 26 is provided with a Perovskite structure conductive oxide film. A composite first electrode 28 is composed of a conductive plug 22, anti-oxide film 24 and seed layer 26. The RuOx anti-oxide film 24 is formed as a random directional poly-crystalline film without a preferential culture so that a film growth property of the seed layer 26 deposited thereon appears.

A (001) oriented Perovskite structure dielectric film 30, composed of BSTO or PLZT, is formed on the seed layer 26 in consideration of a proper lattice matching. A Perovskite structure conductive oxide film composed of SRO, CRO ($CaRuO_3$), LSCO, or YBCO is deposited on the dielectric thin film 30 in consideration of a proper lattice matching to form a second electrode 32 thereon, whereby fabrication of the memory cell capacitor is completed.

Additionally, RuSi is formed between the conductive plug 22 and the RuOx anti-oxide film 24, which respectively compose part of the first electrode 28. Each of the seed layer 26, the dielectric film 30 and the second electrode 32 is formed with a c-axis oriented microcrystalline epitaxial structure in accordance with lattice matching at a high temperature of 650° C. to 750° C.

Since each element of the first electrode 28 including the seed layer 26, the dielectric thin film 30 and the second electrode 32 is composed of a Perovskite structure material, there exist vertical grain boundaries therein in relation to a mutual lattice matching therein. Hence, the capacitor has a two-dimensional poly-crystalline structure, but with an epitaxial structure against the c-axis. When a Perovskite crystal structure having a (001) c-axis epitaxial structure and composed by the layers of the first electrode 28, the dielectric thin film 30, and the second electrode 32 is adopted to a memory cell capacitor fabrication, a high dielectric constant approaching that of a mono-crystalline substrate epitaxial structure is obtained. The grain boundaries are more stable than a poly-crystalline structure, and the interfaces between the films are secured. Hence, the leakage current is reduced, and the TDDB (time-dependent direct breakdown) electrical property is improved.

Figure 3:
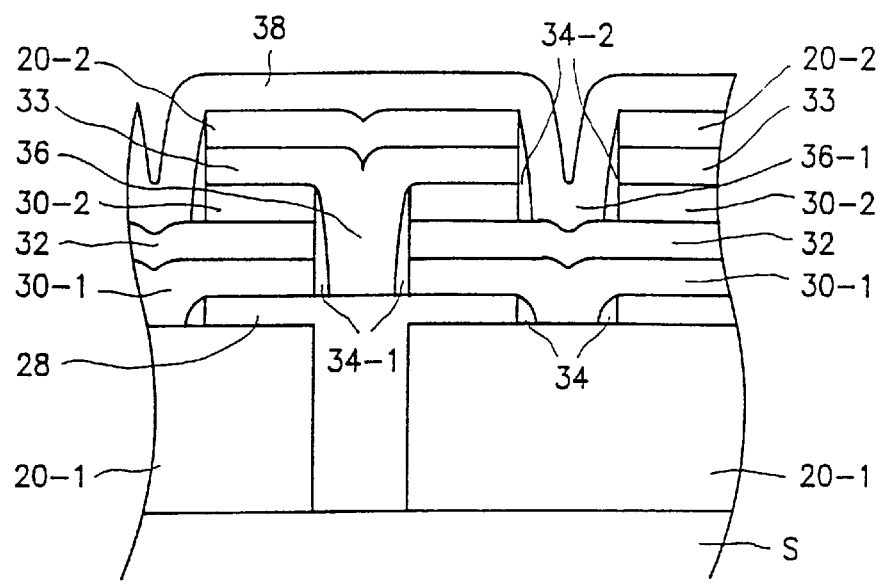
FIG. 3 is a cross-sectional view of a multi-layer fin type capacitor structure of a semiconductor memory cell having high dielectric thin film of a Perovskite structure, in accordance with a second embodiment of the present invention.

FIG. 3 is an illustration of a two-layer fin type capacitor structure, e.g., a multi-layer capacitor structure, of a semi-conductor memory cell in accordance with a second embodiment of the present invention. FIGS. 4A–4D illustrate the fabrication method.

Figure 4A:
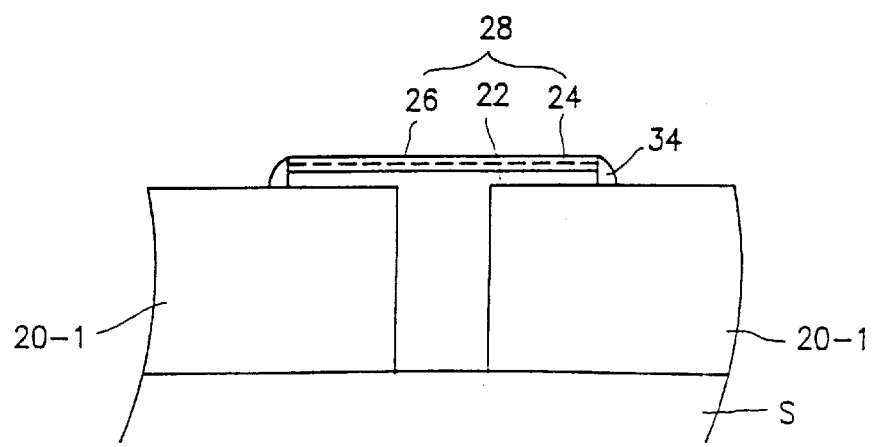
FIGS. 4A through 4D are process views of a fabrication method for a multi-fin type capacitor of a semiconductor memory cell.

First, a first insulation film 20-1 is deposited on a substrate S, as shown in FIG. 4A, and etched to form a first contact hole 21 so that a portion of the surface of the substrate S is exposed. A conductive plug 22 is formed by depositing a poly-silicon on a portion of the insulation film 21-1 including the contact hole. Next, a $RuO_x$ anti-oxide film 24 is formed, and a seed layer 26 is provided as a Perovskite structure conductive oxide layer made of, e.g., YBCO or LSCO. A first electrode 28 serves as a first capacitor lower side electrode composed of conductive plug 22, deoxidation film 24 and seed layer 26. First side wall spacers 34 are formed on each side of the first electrode 28. The $RuO_x$ anti-oxide film 24 is a poly-crystalline film having a random orientation without a preferential growth so that a film growth property of the seed layer 26 thereon may manifest to appear, and the seed layer 26 is formed at a temperature of 650° C. to 750° C.

Figure 4B:
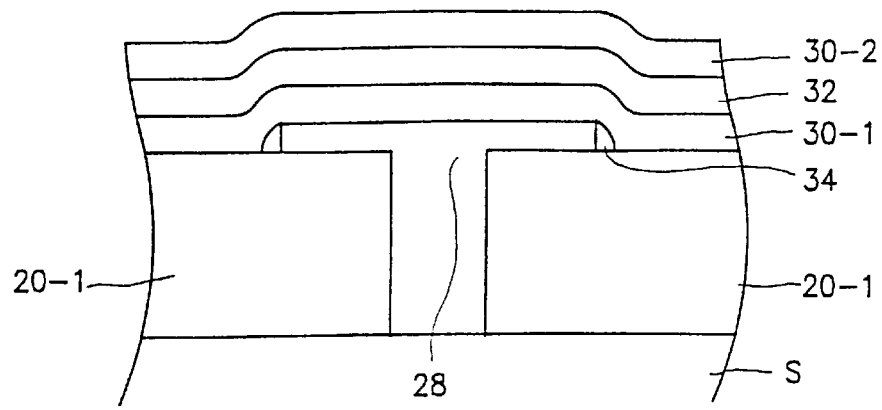

Thereafter, as shown in FIG. 4B, a first dielectric film 30-1 of BSTO or PLZT is deposited over the first insulation film 20-1, first electrode 28 and first side wall spacers 34. A Perovskite structure conductive oxide film of SRO, CRO, YBCO or LSCO is deposited thereon so as to form a second electrode 32, serving as a first capacitor upper side electrode. A second dielectric film 30-2 serving as a second capacitor dielectric film, is deposited. The second electrode 32 serves as both an upper side electrode of the first capacitor and a lower side electrode of a second capacitor, which is to be formed thereon.

Figure 4C:
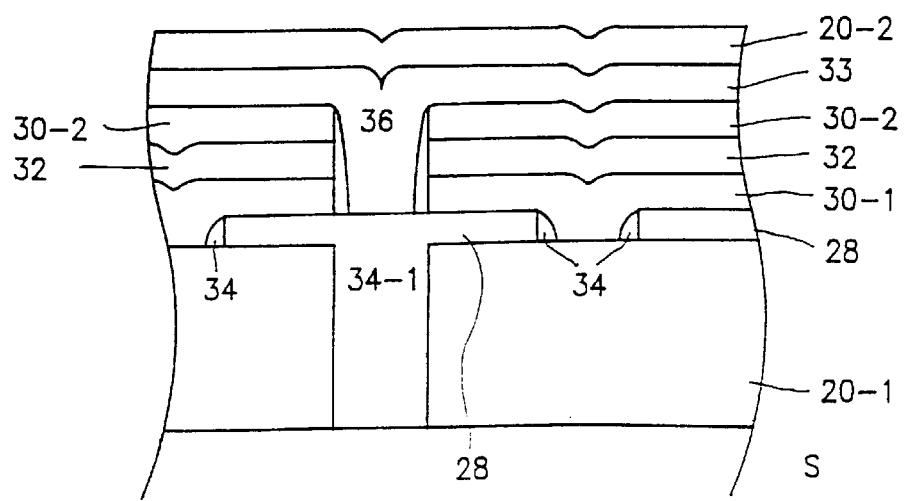

Subsequently, as shown in FIG. 4C, the second dielectric film 30-2, the second electrode 32 and the first dielectric thin film 30-1 are etched so as to form a second contact hole 36 therein so that a portion of the upper surface of the first electrode 28 is exposed. Second side wall spacers 34-1 are formed on each side of the second contact hole 36.

Then, a Perovskite structure conductive oxide layer of SRO, CRO, LSCO or YBCO is deposited on the second dielectric film 30-2 including the second contact hole 36 and the second side wall spacers 34-1, to form a third electrode 33, serving as a second capacitor upper side electrode. Hence, the third electrode 33 of the second capacitor and the first electrode 28 of the first capacitor are connected through the second contact hole 36. The first and second dielectric films 30-1 and 30-2, and the first to third electrodes 28, 32 and 33 are all formed at a temperature of 650° C. to 750° C. Thereafter, a second insulation layer 20-2 is deposited on the third electrode 33.

Figure 4D:
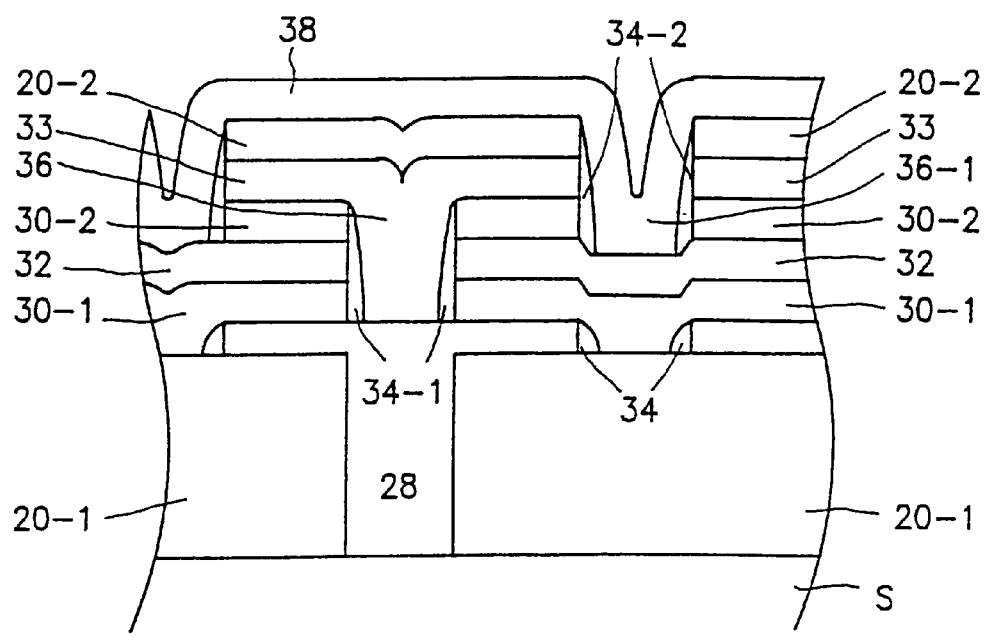

As shown in FIG. 4D, second insulation film 20-2, third electrode 33 and second dielectric film 30-2 are etched to form a third contact hole 36-1 such that a portion of second electrode 32, which is displaced a predetermined length from the second contact hole 36, is exposed, and third side wall spacers 34-2 are formed on each side wall of the third contact hole 36-1. The capacitor fabrication is completed when a fourth electrode 38, serving as an upper top electrode thereof, is formed on the second insulation film 20-2 including the third contact hole 36-1 and third side wall spacers 34-2, and connected with the second electrode 32.

The above-described memory cell capacitor fabricated in accordance with the present invention exhibits much more stabilized grain boundaries and interfaces between films therein than those of a poly-crystalline structure as well as a high dielectric constant close to that of an epitaxial structure of a mono-crystalline substrate. A (001) c-axis epitaxial Perovskite crystalline structure is composed of the first electrode, dielectric thin film and second electrode to a semiconductor memory cell capacitor fabrication. The trapped charge density occurring at interfaces between an electrode and a dielectric film is significantly reduced, and subsequently, the leakage current therein is decreased. Further, the TDDB (time-dependent direct breakdown) property is improved.

The foregoing embodiment is merely exemplary and not to be construed as limiting the present invention. The present scheme can be readily applied to other types of semiconductor devices. One of ordinary skill in the art can use the teachings of the present invention to other devices having Perovskite structure requiring decreased leakage current and an improved time-dependent direct breakdown property. The description of the present invention is intended to be illustrative, and not limiting the scope of the claims. Many alternatives, modifications and variations will be apparent to those skilled in the art.

What is claimed is:

1. A capacitor structure, comprising:
  a substrate;
  an insulation film formed on said substrate,, wherein a contact hole is formed in the insulation film so that a portion of the substrate is exposed therethrough;
  a composite first electrode formed on the insulation film including said contact hole, wherein the composite first electrode comprises a conductive plug, an anti-oxide film formed on said conductive plug and a Perovskite structure conductive seed layer formed on said anti-oxide film;
  a Perovskite structure dielectric film formed on said composite first electrode; and
  a Perovskite structure second electrode formed on said dielectric film.

2. The capacitor structure of claim 1, wherein said Perovskite structure conductive seed layer includes a material selected from the group comprising $YBa_2Cu_3O_{7-x}$, $La_{1-x}Sr_xCo_1O_3$ (x=0.5) and $La_{2-x}Sr_xCu_1O_4$ (x=0.15).

3. The capacitor structure of claim 1, wherein said anti-oxide film includes $RuO_x$.

4. The capacitor structure of claim 1, wherein said conductive plug and said anti-oxide film are poly-crystalline.

5. The capacitor structure of claim 1, wherein the Perovskite structure second electrode includes a material selected from the group comprising $SrRuO_3$, $YBa_2Cu_3O_{7-x}$, $La_{1-x}Sr_xCo_1O_3$ (x=0.5) and $La_{2-x}Sr_xCu_1O_4$ (x=0.15).

6. The capacitor structure of claim 1, wherein said Perovskite structure dielectric film includes a material selected from the group comprising $(Ba_{0.5}, Sr_{0.5})TiO_3$ and $Pb(La,Zr)TiO_3$.

7. A semiconductor memory cell capacitor structure, comprising:
  a substrate;
  a first insulation film formed on said substrate and having a contact hole therein so that a portion of the substrate is exposed therethrough;
  a first electrode formed on said first insulation film including said contact hole, said first electrode comprising a conductive plug, an anti-oxide film formed thereon and a Perovskite structure conductive seed layer formed thereon;
  first side wall spacers formed on each side of said first electrode;
  a Perovskite structure first dielectric film formed on said first insulation film, said first electrode and said first side wall spacers, so that a portion of said first electrode is exposed through said first dielectric film;
  a Perovskite structure second electrode formed on said first dielectric film;
  a Perovskite structure second dielectric film formed on said second electrode so as to have a width that is approximately equal to a width of said first electrode;
  second side wall spacers formed on sides of said first dielectric film, said second electrode and said second dielectric film;
  a Perovskite structure third electrode formed on said second dielectric film including said second side wall spacers and the exposed portion of said first electrode;
  a second insulation film formed on said third electrode;
  third side wall spacers formed on sides of said second dielectric film, said third electrode and said second insulation film; and
  a fourth electrode formed on said second insulation film including each of said third side wall spacers and a surface of said second electrode.

8. The capacitor structure of claim 7, wherein said Perovskite structure conductive seed layer includes a material selected from the group comprising $YBa_2Cu_3O_{7-x}$, $La_{1-x}Sr_xCo_1O_3$ (x=0.5) and $La_{2-x}Sr_xCu_1O_4$ (x=0.15).

9. The capacitor structure of claim 7, wherein said anti-oxide film includes $RuO_x$.

10. The capacitor structure of claim 7, wherein said conductive plug and said anti-oxide film are poly-crystalline.

11. The capacitor structure of claim 7, wherein said Perovskite structure second and third electrodes include a material selected from the group comprising $CaRuO_3$, SrRuO$_3$, YBa$_2$Cu$_3$O$_{7-x}$, La$_{1-x}$Sr$_x$Co$_1$O$_3$ (x=0.5) and La$_{2-x}$Sr$_x$Cu$_1$O$_4$ (x=0.15).

12. The capacitor structure of claim 7, wherein said Perovskite structure first and second dielectric films include a material selected from the group comprising (Ba$_{0.5}$, Sr$_{0.5}$)TiO$_3$ and Pb(La,Zr)TiO$_3$.

13. A semiconductor device comprising:
   a first composite electrode including a polysilicon layer, a polycrystalline anti-oxide film and a first Perovskite structure conductive oxide film;
   a second electrode including a second Perovskite structure conductive oxide film; and
   a Perovskite structure dielectric film formed between said first composite electrode and said second electrode.

14. The semiconductor device of claim 13, wherein said first and second Perovskite structure conductive oxide films and said first Perovskite structure dielectric film have a c-axis oriented microcrystalline epitaxial structure.

15. The semiconductor device of claim 13, wherein said first Perovskite structure conductive oxide film is a material selected from the group comprising YBa$_2$Cu$_3$O$_{7-x}$, La$_{1-x}$Sr$_x$Co$_1$O$_3$ (x=0.5) and La$_{2-x}$Sr$_x$Cu$_1$O$_4$ (x=0.15).

16. The semiconductor device of claim 13, wherein said anti-oxide film is a poly-crystalline having RuO$_x$.

17. The semiconductor device of claim 13, wherein said second Perovskite structure conductive oxide film is a material selected from the group comprising SrRuO$_3$, YBa$_2$Cu$_3$O$_{7-x}$, La$_{1-x}$Sr$_x$Co$_1$O$_3$ (x=0.5) and La$_{2-x}$Sr$_x$Cu$_1$O$_4$ (x=0.15).

18. The semiconductor device of claim 13, wherein said Perovskite structure dielectric film is a material selected from the group comprising (Ba$_{0.5}$, Sr$_{0.5}$)TiO$_3$ and Pb(La,Zr)TiO$_3$.

19. The semiconductor device of claim 13 further comprising
   a third electrode having a third conductive oxide layer connected to said first composite electrode; and
   a second Perovskite structure dielectric film formed between said second and third electrodes.

20. The semiconductor device of claim 19 further comprising
   a fourth electrode connected to said second electrode; and
   an insulation film formed between said third and fourth electrodes.

21. The semiconductor device of claim 19, wherein said third conductive oxide layer is a material selected from the group comprising CaRuO$_3$, SrRuO$_3$, YBa$_2$Cu$_3$O$_{7-x}$, La$_{1-x}$Sr$_x$Co$_1$O$_3$ (x=0.5) and La$_{2-x}$Sr$_x$Cu$_1$O$_4$ (x=0.15).

22. The semiconductor device of claim 19, wherein said second Perovskite structure dielectric film is a material selected from the group comprising (Ba$_{0.5}$, Sr$_{0.5}$)TiO$_3$ and Pb(La,Zr)TiO$_3$.

* * * * *